(12) United States Patent
Aburakawa et al.

(10) Patent No.: US 11,398,354 B2
(45) Date of Patent: Jul. 26, 2022

(54) THIN FILM CAPACITOR, MANUFACTURING METHOD THEREFOR, AND SUBSTRATE WITH BUILT-IN ELECTRONIC COMPONENT

(71) Applicant: TDK CORPORATION, Tokyo (JP)

(72) Inventors: Yuuki Aburakawa, Tokyo (JP); Tatsuo Namikawa, Tokyo (JP); Suguru Andoh, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 371 days.

(21) Appl. No.: 16/658,503

(22) Filed: Oct. 21, 2019

(65) Prior Publication Data
US 2020/0135406 A1 Apr. 30, 2020

(30) Foreign Application Priority Data

Oct. 31, 2018 (JP) .............................. JP2018-205686
Oct. 16, 2019 (JP) .............................. JP2019-189224

(51) Int. Cl.
| | |
|---|---|
| *H01G 4/33* | (2006.01) |
| *H05K 1/11* | (2006.01) |
| *H01G 4/008* | (2006.01) |
| *H01G 4/30* | (2006.01) |
| *H01G 4/012* | (2006.01) |
| *H05K 1/16* | (2006.01) |

(52) U.S. Cl.
CPC ............. *H01G 4/33* (2013.01); *H01G 4/0085* (2013.01); *H01G 4/012* (2013.01); *H01G 4/306* (2013.01); *H05K 1/115* (2013.01); *H05K 1/162* (2013.01)

(58) Field of Classification Search
CPC ...... H01G 4/008; H01G 4/0085; H01G 4/012; H01G 4/306; H01G 4/33; H05K 1/115; H05K 1/162
See application file for complete search history.

(56) References Cited

U.S. PATENT DOCUMENTS

| | | | |
|---|---|---|---|
| 10,121,728 B2 * | 11/2018 | Yamaki | ................... H01L 28/82 |
| 2017/0025324 A1 | 1/2017 | Yamaki et al. | |
| 2021/0257164 A1 * | 8/2021 | Hiraoka | ................... H01G 4/33 |

FOREIGN PATENT DOCUMENTS

| | | | |
|---|---|---|---|
| JP | 2010171397 A | | 8/2010 |
| JP | 2017028096 A | | 2/2017 |
| JP | 2020072192 A | * | 5/2020 |

\* cited by examiner

*Primary Examiner* — Nathan Milakovich
(74) *Attorney, Agent, or Firm* — Young Law Firm, P.C.

(57) ABSTRACT

A thin film capacitor is provided with a lower electrode made of a metal foil containing many metal grains, a dielectric thin film formed on an upper surface of the lower electrode, and an upper electrode formed on an upper surface of the dielectric thin film. A lower surface of the lower electrode is an etched surface from which cross sections of the metal grains appear. The height difference between the cross sections of adjacent metal grains in the etched surface is 1 μm or more and 8 μm or less.

7 Claims, 12 Drawing Sheets

THIN FILM CAPACITOR, MANUFACTURING METHOD THEREFOR, AND SUBSTRATE WITH BUILT-IN ELECTRONIC COMPONENT

BACKGROUND OF THE INVENTION

Field of the Invention

The present invention relates to a thin film capacitor and a manufacturing method therefor and, more particularly, to a thin film capacitor constituted by using a thinned electrode and a manufacturing method therefor. The present invention also relates to a substrate with built-in electronic component incorporating a thin film capacitor.

Description of Related Art

Thickness reduction of electronic components has been advancing rapidly and, correspondingly, as for, e.g., capacitors, there is an increased need for a thin film capacitor in which a dielectric thin film and an upper electrode are formed in this order on a lower electrode made of a metal foil.

For example, Japanese Patent Application Laid-Open No. 2017-028096 describes a thin-film capacitor including: a first electrode layer, a second electrode layer, and a dielectric layer provided between the first and second electrode layers, wherein the ratio (S/S0) of the surface area of one surface of the first electrode layer that is opposite to the dielectric layer to the projected area of the first electrode layer in the thickness direction thereof is 1.01 to 5.00. According to this thin-film capacitor, heat generated from a semiconductor element can be efficiently dissipated.

Further, Japanese Patent Application Laid-Open No. 2010-171397 describes a method for manufacturing a thin-film capacitor including a step of annealing a metal foil at a temperature of 800° C. or higher, a step of forming a dielectric thin film on the metal foil such that the ratio of the crystal grain size of the annealed metal foil to the film thickness of the dielectric thin film becomes 104 to 560, a step of sintering the dielectric thin film by heating the metal foil and dielectric thin film, and a step of forming an upper electrode on the sintered dielectric thin film.

In recent years, a further reduction in the thickness of the thin film capacitor has been required and, particularly, a further reduction in the thickness of the lower electrode has been required. However, when the lower electrode is thinned by a known etching method, etching of a grain boundary component proceeds excessively as compared with the etching of metal grains in the lower electrode, with the result that unevenness of the etched surface becomes significantly large, and efficient thinning of the lower electrode cannot be achieved. Further, in this case, the surface of the metal grain and the grain boundary component are exposed in a larger area, whereas the cross section of the metal grain is not exposed, so that heat dissipation property is not enhanced even when the unevenness becomes large.

SUMMARY

An object of the present invention is therefore to provide a thin film capacitor having a reduced thickness and an excellent heat dissipation property and a manufacturing method therefor. Another object of the present invention is to provide a substrate with built-in electronic component incorporating such a thin-film capacitor.

To solve the above problems, a thin film capacitor according to the present invention includes a lower electrode made of a metal foil containing many metal grains, a dielectric thin film formed on an upper surface of the lower electrode, and an upper electrode formed on an upper surface of the dielectric thin film. A lower surface of the lower electrode is an etched surface from which the cross sections of the metal grains appear, and a height difference between the cross sections of adjacent metal grains in the etched surface is 1 μm or more and 8 μm or less.

According to the present invention, the thin film capacitor can be constituted using the lower electrode thinned by etching to thereby achieve thinning of the entire thin film capacitor. Further, the lower surface of the lower electrode has adequate unevenness, and the cleaved cross sections of the metal grains are exposed from the lower surface, whereby the heat dissipation property of the thin film capacitor can be enhanced. Furthermore, when the lower surface of the lower electrode is covered with a resin layer, adhesion between the lower electrode and the resin layer can be enhanced due to the presence of the adequate unevenness on the lower surface of the lower electrode.

In the thin film capacitor according to the present invention, assuming that a number of the metal grains each of whose cross section of (111) plane±20° appears from the etched surface is $N_{111}$, a number of the metal grains each of whose cross section of (100) plane±20° appears from the etched surface is $N_{100}$, and a number of the metal grains each of whose cross section of (110) plane±20° appears from the etched surface is $N_{110}$, a relationship: $N_{111} > N_{100} > N_{110}$ is preferably satisfied. The (111) plane of the metal crystal has a high atomic density and is thus strongly bound with oxygen. Therefore, when the (111) plane of the metal grains preferentially appear from the etched surface, it is bound with oxygen in the resin to thereby enhance adhesion between the lower electrode and resin.

In the present invention, an average grain size of the metal grains is preferably 10 μm or more and 25 μm or less. When the metal foil constituting the lower electrode is annealed ahead of time, the metal grains constituting the metal foil are grown, so that the crystal grain size becomes larger. The metal grains are grown also in the subsequent heat treatment for sintering a precursor layer of the dielectric thin film, and the average grain size of the metal grains becomes 10 μm to 25 μm, as described above. When the metal foil is constituted by crystal grains of comparatively large size, the heat dissipation property of the thin film capacitor can be enhanced by exposing the cross sections of the metal grains from the etched surface and making the height difference between the cross sections of the metal grains 8 μm or less. Further, when the thin film capacitor is embedded in a substrate, adhesion between the lower electrode and resin can be enhanced.

In the present invention, the metal foil is preferably an Ni foil, and the metal grains are preferably Ni grains. The Ni foil is inexpensive and easy to process and is thus suitable as a material of the lower electrode of the thin film capacitor. Further, in the Ni foil, there is significant coarsening of the crystal grains after the annealing or sintering of the dielectric thin film precursor layer, and therefore, the effect of the present invention is conspicuous.

In the present invention, a side surface of the lower electrode is preferably the etched surface from which the cross sections of the metal grains appear like the lower surface of the lower electrode. This can further enhance heat dissipation property of the thin film capacitor and adhesion between the lower electrode and resin.

A thin film capacitor manufacturing method according to the present invention includes a step of forming a dielectric thin film on an upper surface of a lower electrode, a step of forming an upper electrode on an upper surface of the dielectric thin film, and a step of thinning the lower electrode. The step of thinning the lower electrode includes a step of etching a lower surface of the lower electrode using an etching solution mainly containing $Na_2SO_8.H_2SO_4$.

According to the present invention, not only the grain boundary component of the metal grains constituting the lower electrode, but also the metal grains can be uniformly etched. Thus, it is possible to expose the cross sections of the metal grains from the etched surface and thereby to enhance heat dissipation property of the thin film capacitor and adhesion between the lower electrode and resin.

In the present invention, the etching solution preferably contains an additive used as a leveling agent in an electrolytic plating process. This can further reduce the difference in dissolution rate between the metal grains and grain boundary component, thus further enhancing the flatness of the etched surface.

In the present invention, the step of forming the dielectric thin film on the upper surface of the lower electrode preferably includes a step of annealing the lower electrode at a temperature of 300° C. or higher, a step of forming a precursor layer of the dielectric thin film on the upper surface of the lower electrode, and a step of sintering the precursor layer. When the metal foil constituting the lower electrode is annealed ahead of time, the growth of the metal grains constituting the metal foil proceeds, thus the crystal grain size becomes larger. The metal grains are grown also in the subsequent heat treatment for sintering a precursor layer of the dielectric thin film, and the average grain size of the metal grains becomes very large. However, when the lower electrode is etched using the above etching solution, it is possible to expose the cross sections of the metal grains from the etched surface even when the metal foil is constituted by large crystal grains, thereby enhancing heat dissipation property of the thin film capacitor. Further, when the thin film capacitor is embedded in a substrate, adhesion between the lower electrode and resin can be enhanced.

The thin film capacitor manufacturing method according to the present invention preferably further includes, before the step of thinning the lower electrode, a step of covering the upper surface of the lower electrode on which the dielectric thin film and upper electrode are formed in this order with an upper resin layer. Thus, it is possible to protect the dielectric thin film and upper electrode when the lower electrode is etched.

The thin film capacitor manufacturing method according to the present invention preferably further includes, after the step of thinning the lower electrode, a step of covering the lower surface of the lower electrode with a lower resin layer. Thus, it is possible to produce a thin film capacitor in which the upper and lower surfaces of a capacitor element constituted of the lower electrode, dielectric thin film and upper electrode are covered with the resin layer. With this configuration, it is possible to prevent degradation in the insulation resistance of the thin film capacitor caused due to the influence of a hydrogen radical or $H_2O$ generated at the time of embedding the thin film capacitor in the substrate.

The thin film capacitor manufacturing method according to the present invention preferably further includes a step of forming a side surface of the lower electrode by etching after the step of thinning the lower electrode and before the step of covering the lower surface of the lower electrode with the lower resin layer. In the step of forming the side surface of the lower electrode by etching, the lower electrode is preferably etched using an etching solution mainly containing $Na_2SO_8.H_2SO_4$, and, in the step of covering the lower surface of the lower electrode with the lower resin layer, the side surface of the lower electrode is preferably covered with the lower resin layer. Thus, on the side surface of the lower electrode, not only the grain boundary component but also the metal grains can be uniformly etched, and thus, the cross sections of the metal grains can also be exposed from the side surface of the lower electrode as well as the lower surface, whereby the heat dissipation property of the thin film capacitor and adhesion between the lower electrode and resin can be enhanced.

A substrate with built-in electronic component according to the present invention includes a multilayer substrate, a thin film capacitor embedded in an inside of the multilayer substrate, according to the present invention having the features described above, a first via hole electrode formed in the multilayer substrate so as to be electrically connected to the lower electrode of the thin film capacitor, and a second via hole electrode formed in the multilayer substrate so as to be electrically connected to the upper electrode of the thin film capacitor.

In this case, it is preferable that the multilayer substrate includes a first insulating layer and a second insulating layer formed on the upper surface of the first insulating layer, the thin film capacitor is provided on the upper surface of the first insulating layer, the second insulating layer is formed on the upper surface of the first insulating layer so as to embed therein the thin film capacitor, the first via hole electrode is provided in a first contact hole formed in the second insulating layer so as to expose therethrough the lower electrode, and the second via hole electrode is provided in a second contact hole formed in the second insulating layer so as to expose therethrough the upper electrode. According to the present invention, thinning of the substrate with built-in electronic component can be achieved.

According to the present invention, there can be provided provide a thin film capacitor having a reduced thickness and an excellent heat dissipation property and a manufacturing method therefor. Further, according to the present invention, there can be provided a substrate with built-in electronic component incorporating such a thin-film capacitor.

BRIEF DESCRIPTION OF THE DRAWINGS

The above and other objects, features and advantages of this invention will become more apparent by reference to the following detailed description of the invention taken in conjunction with the accompanying drawings, in which:

FIG. 4A illustrates a state before etching, FIG. 4B illustrates a state after etching using a conventional etching method, and FIG. 4C illustrates a state after etching using an etching method according to the present invention;

FIGS. 5A and 5B are views illustrating the structure of a thin film capacitor according to a second embodiment of the present invention, wherein FIG. 5A is a schematic side cross-sectional view, and FIG. 5B is a schematic top view;

FIGS. 6A to 6C are plan views of the thin film capacitor of FIGS. 5A and 5B, wherein FIG. 6A illustrates the upper electrode 13, FIG. 6B illustrates the dielectric thin film 12, and FIG. 6C illustrates the lower electrode 11;

FIGS. 10A and 10B show the result of the evaluation of the etched surface of the lower electrode (Ni foil) according to Comparative Example of the thin film capacitor, wherein FIG. 10A is SEM image, and FIG. 10B is a graph showing the height difference of the etched surface;

FIGS. 11A and 11B show the result of the evaluation of the etched surface of the lower electrode (Ni foil) according to Example 1 of the thin film capacitor, wherein FIG. 11A is SEM image, and FIG. 11B is a graph showing the height difference of the etched surface; and FIGS. 12A and 12B show the result of the evaluation of the etched surface of the lower electrode (Ni foil) according to Example 2 of the thin film capacitor, wherein FIG. 12A is SEM image, and FIG. 12B is a graph showing the height difference of the etched surface.

DETAILED DESCRIPTION OF THE EMBODIMENTS

Hereinafter, preferred embodiments of the present invention will be described with reference to the accompanying drawings.

Figure 1:
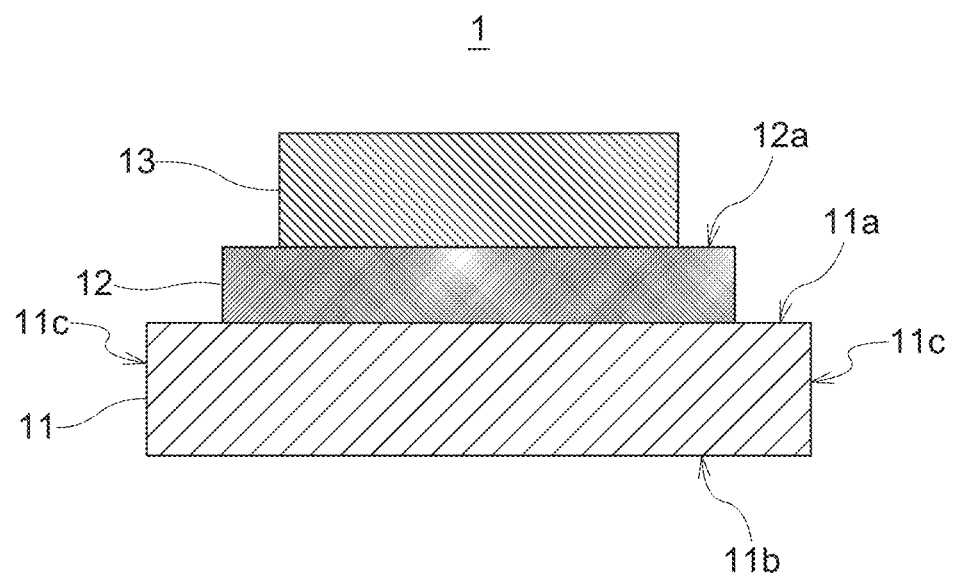
FIG. 1 is a schematic cross-sectional view illustrating the structure of a thin film capacitor according to a first embodiment of the present invention.

FIG. 1 is a schematic cross-sectional view illustrating the structure of a thin film capacitor according to a first embodiment of the present invention.

As illustrated in FIG. 1, a thin film capacitor 1 includes a lower electrode 11, a dielectric thin film 12 formed on an upper surface 11a of the lower electrode 11, and an upper electrode 13 formed on an upper surface 12a of the dielectric thin film 12. The dielectric thin film 12 is provided between the lower electrode 11 and the upper electrode 13.

The lower electrode 11 is preferably made of a metal foil mainly including noble metal such as Ni, Cu, Al or Pt, or an alloy thereof and particularly preferably made of an Ni foil. The metal foil has a function as a lower electrode, a function of an underlying surface on which a dielectric thin film is formed, and a function of supporting the dielectric thin film. The thickness of the metal foil is 5 μm to 50 μm, preferably, 10 μm to 30 μm, and particularly preferably, 10 μm to 15 μm. By thus thinning the lower electrode 11, thinning of the thin film capacitor 1 can be achieved.

The dielectric thin film 12 is preferably formed using perovskite oxide such as barium titanate ($BaTiO_3$), barium strontium titanate (($BaSr)TiO_3$), strontium titanate ($SrTiO_3$), barium zirconium strontium titanate (($BaSr$) ($TiZr)O_3$), or barium zirconium titanate ($BaTiZrO_3$). The dielectric thin film 12 may contain one or more of the above oxides. The film thickness of the dielectric thin film 12 is preferably about 30 nm to 5 μm, and the range thereof is preferably adjusted to a suitable one based on the crystal grain size of the metal foil constituting the lower electrode 11.

The planar size of the dielectric thin film 12 is preferably smaller than that of the lower electrode 11. This is because when the dielectric thin film 12 is cut together with the metal foil constituting the lower electrode 11, cracks may occur in the dielectric thin film 12.

For cost reduction, the upper electrode 13 is preferably formed mainly using an inexpensive base metal material as the main component. Particularly, Cu is preferably used as the main component. The upper electrode 13 may contain at least one of Ni, Pt, Pd, Ir, Ru, Rh, Re, Os, Au, Ag, Cu, $IrO_2$, $RuO_2$, $SrRuO_3$ and $LaNiO_3$.

In the present embodiment, the lower electrode 11 is subjected to etching at its lower surface 11b to be thinned, whereby the cross sections of more metal grains appear from the lower surface 11b, with the result that the metal grains slightly differ in the height of the cross section thereof. The average height difference between the cross sections of adjacent metal grains is preferably 1 μm or more and 8 μm or less. The height difference between the cross sections of the metal grains is thought to occur due to a difference in etching rate with respect to a crystal orientation.

When many grain boundaries appear from the surface of the lower electrode 11, heat dissipation property is degraded. This is because the grain boundary component is a component having low purity in which impurities in the metal foil are precipitated and thus has low heat conductivity. However, when the cross sections of the metal grains appear from the surface of the lower electrode 11, heat dissipation property can be enhanced. The exposure ratio of the cross sections of the metal grains to the entire etched surface of the lower electrode 11 is preferably 60% or more and particularly preferably 80% or more.

The lower electrode 11 may be subjected to etching not only at the lower surface 11b but also at a side surface 11c. In this case, the cross sections of the metal grains appear from both the lower surface 11b and side surface 11c, making it possible to further enhance heat dissipation property.

The average grain size of the metal grains constituting the lower electrode 11 is preferably 10 μm or more and 25 μm or less. Although details will be described later, in order to form the dielectric thin film 12 on the lower electrode 11, it is necessary to sinter a dielectric material formed on the upper surface 11a of the lower electrode 11 and it is preferable to anneal the metal foil before formation of the dielectric thin film 12 so as to prevent cracks from occurring in the dielectric thin film 12. When such heat treatment is applied to the metal foil, the metal grains constituting the metal foil grow greatly, and the average grain size thereof falls within the above range.

The number $N_{111}$ of the metal grains each of whose cross section of (111) plane±20° appears from the lower surface 11b of the lower electrode 11 is preferably larger than the number $N_{100}$ of the metal grains each of whose cross section of (100) plane±20° appears therefrom, and the number $N_{100}$ of the metal grains each of whose cross section of (100) plane±20° appears from the lower surface 11b of the lower electrode 11 is preferably larger than the number $N_{110}$ of the metal grains each of whose cross section of (110) plane±20° appears therefrom. That is, the relationship: $N_{111}>N_{100}>N_{110}$ is preferably satisfied.

Resin contains a certain degree of oxygen, and metal is bonded to the oxygen in the resin to tightly adhere to the resin. Thus, when a (111) plane having high atomic number density appears preferentially from the surface of the lower electrode 11, it is possible to enhance not only the heat dissipation property of the thin film capacitor but also adhesion between the lower electrode 11 and resin when the thin film capacitor 1 is embedded in the resin.

The plane orientation of the crystal grains exposed on the surface of the lower electrode 11 can be evaluated by EBSD (Electron Back Scatter Diffraction). The EBSD is one of crystal analysis methods for a submicron range using a SEM (Scanning Electron Microscope). When an electron beam is irradiated to a sample inclined at about 60° to 70°, the electron beam is scattered on each crystal plane in a shallow region from the surface of the sample to a depth of about 50 nm. However, in the case of a crystalline sample, the electron beam is diffracted, causing a pattern (EBSD pattern) according to a crystal orientation to appear. By photographing the EBSD pattern by an EBSD detector (CCD camera) and analyzing it, information concerning the crystal orientation of the sample can be acquired, based on which the orientation mapping of the crystal grains, texture, and crystal phase distribution can be analyzed. In the EBSD, it is only necessary to apply the electron beam on crystal grains to be analyzed, so that a special device need not be added to an electro-optical system, and it is sufficient to only add the EBSD detector to the SEM.

Figure 2:
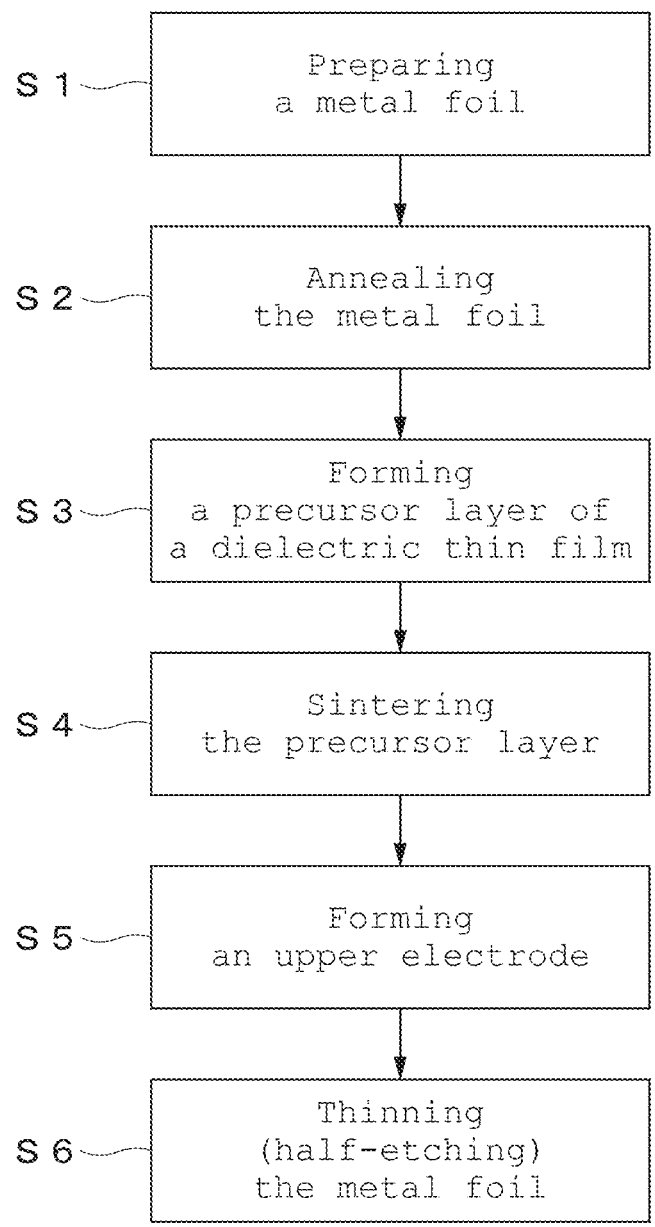
FIG. 2 is a flowchart for explaining a manufacturing method for the thin film capacitor.

FIG. 2 is a flowchart for explaining a manufacturing method for the thin film capacitor.

As illustrated in FIG. 2, in the manufacture of the thin film capacitor 1, first a metal foil constituting the lower electrode 11 is prepared (S1: metal foil preparation step). As described above, an Ni foil is preferably used as the metal foil, and the thickness thereof is preferably 5 μm to 50 μm. As a manufacturing method for the metal foil, there are available an electrolytic method (plating method, sputtering method, vapor deposition method, CVD method, etc.) and a rolling method, among which the electrolytic method causing no processing strain in the metal foil in a manufacturing process is more preferable, and the plating method allowing a high-purity metal foil containing less impurities to be obtained is particularly preferable.

Then, the metal foil is annealed in a reducing atmosphere or a vacuum atmosphere so as to alleviate the strain in the metal foil (S2: annealing step). The annealing temperature may be high enough to cause grain growth of crystal in the metal foil (300° C. or higher), more preferably, 300° C. to 1300° C., and particularly preferably 300° C. to 1000° C. The annealing time is preferably one minute to four hours. The temperature-rising rate only needs to be 5° C./min or higher and, preferably, 500° C./min or higher. The strain in the metal foil can be controlled by the annealing temperature and annealing time, and the higher the annealing temperature is, the more quickly the strain in the crystal can be alleviated. Specifically, in a state where the strain in the metal foil is alleviated, the Vickers hardness of the metal foil is preferably lower than about 100 HV. The relationship between the annealing temperature and annealing time may be set such that the higher the annealing temperature, the shorter the annealing time can be.

The "vacuum atmosphere" in the present embodiment refers to a reduced-pressure atmosphere having a pressure of $1\times10^3$ Pa or lower. In general, the pressure in the vacuum atmosphere is preferably $1\times10^{-5}$ Pa to $1\times10^2$ Pa, and more preferably, $1\times10^{-3}$ Pa to 10 Pa. Particularly, when the metal foil is mainly composed of Ni, the pressure is preferably $2\times10^{-3}$ Pa to $8\times10^{-1}$ Pa. The "reducing atmosphere" refers to an atmosphere containing a mixture gas of nitrogen, hydrogen, and vapor, a hydrogen-containing atmosphere formed from ammonia, or an atmosphere where the oxygen partial pressure level therein is controlled to 1 vol % or lower with gas containing CO and $CO^2$. By performing heat treatment under such conditions, oxidation of the metal foil such as an Ni foil is suppressed.

Hereinafter, the "grain growth" will be described with reference to FIGS. 3A and 3B. In the present embodiment, the "grain growth" refers to a process in which by applying heat treatment to a metal foil initially having a fine polycrystalline structure, the grain boundary of fine crystals is moved to become large while eroding adjacent crystal grains.

Figure 3A:
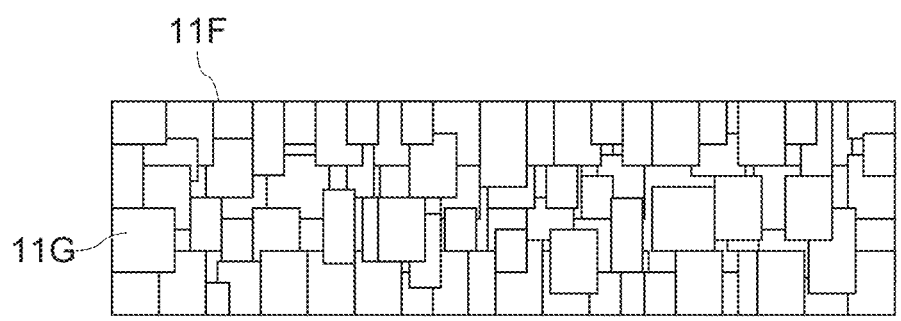
FIGS. 3A and 3B are views for explaining the grain growth of the crystal grains in the metal foil.
Figure 3B:
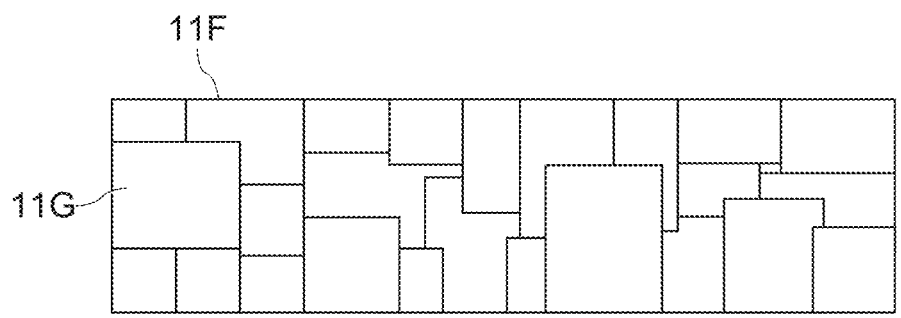

For example, as illustrated in FIG. 3A, a metal foil 11F initially has a structure containing fine crystal grains 11G having various grain sizes of about 20 nm to 60 nm. As the grain growth proceeds, individual crystal grains 11G become larger as illustrated in FIG. 3B. As the crystal grain is further grown to a certain large size, its size may no longer increase due to saturation of the grain growth. The grain size at this time is referred to as "saturated grain size". The "crystal grain size" refers to the size of each crystal grain and is specifically an average grain size calculated by a "cord method". In the code method, the surface of an object is observed with an optical microscope, a straight line L is arbitrarily drawn on the observation surface, and the number of intersections N between the straight line L and the grain boundary is counted. Next, L is divided by N to obtain an average length l=L/N between the grain boundaries, and further the average length l is multiplied by a statistical numerical value k (e.g., K=1.7776). Thus, the average particle diameter D=k×(L/N) is obtained (reference: "Characterization Technology of Ceramics", Japan Ceramics Association, p7). The crystal grain size can be controlled by impurities in the metal foil, annealing temperature, and annealing time.

Then, a precursor layer of a dielectric thin film such as barium titanate is formed on the metal foil that has been subjected to annealing (S3: dielectric thin film precursor layer formation step). The precursor layer may be formed by using, e.g., a sputtering method, a CSD method (Chemical Solution Deposition method) or a CVD method. It is often the case that the precursor layer is not sufficiently crystallized. In order to proceed crystallization, a sintering step to be described below is required.

Then, the precursor layer formed on the metal foil is heated under a vacuum atmosphere or a reducing atmosphere to be sintered (S4: sintering step). Through this sintering step, a dielectric body that has not yet been sufficiently crystallized is crystallized, whereby the dielectric thin film 12 having a high dielectric constant can be obtained. The heating temperature for sintering is preferably 300° C. to 1000° C. The heating time is preferably 10 minutes to 90 minutes. By this sintering, a dielectric body having a high dielectric constant can be obtained. Even in this sintering step S4, metal grains in the metal foil are grown, so that the crystal grain size becomes larger.

Then, the upper electrode 13 is formed on the dielectric thin film 12 (S5: upper electrode formation step). The material of the upper electrode 13 is, e.g., Cu. The upper electrode 13 may be formed by a sputtering method, an electrolytic plating method, an electroless plating method, a vapor deposition method, or the like.

Then, the lower surface of the metal foil is etched to thin the lower electrode 11 (S6: lower electrode thinning step). In the step S6 of thinning the lower electrode 11, an etching solution mainly containing $Na_2SO_8 \cdot H_2SO_4$ is used to half-etch the lower surface of the lower electrode 11. In this case, the etching solution preferably contains an additive used as a leveling agent in the electrolytic plating process. Using the etching solution containing such an additive allows flatness of the etched surface to be enhanced. In this way, the lower electrode 11 is thinned to a thickness of about 10 μm, for example. Thus, the basic structure of the thin film capacitor according to the present embodiment is completed.

From the lower surface 11b of the lower electrode 11 thus half-etched, the cleaved cross sections of the crystal grains appear, showing slight height differences among the cross sections of the respective metal grains. The average height difference between the cross sections of adjacent metal grains in the etched surface is preferably 1 µm or more and 8 µm or less. When the side surface 11c of the lower electrode 11 as well as the lower surface 11b is half-etched, the cross sections of the crystal grains appear also from the side surface 11c, causing such height differences.

Figure 4A:
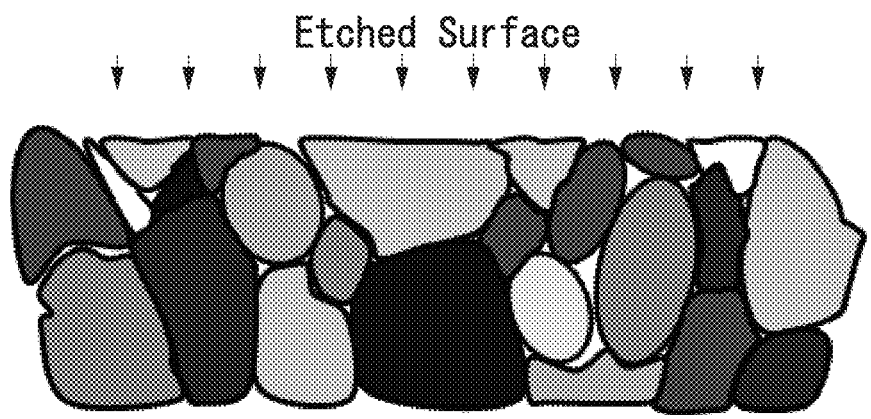
FIGS. 4A to 4C are schematic cross-sectional views for explaining the structure of the lower electrode, and more specifically.
Figure 4B:
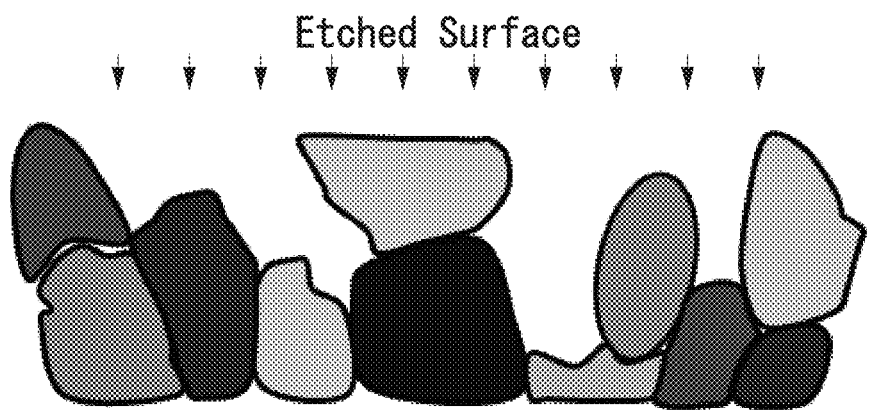
Figure 4C:
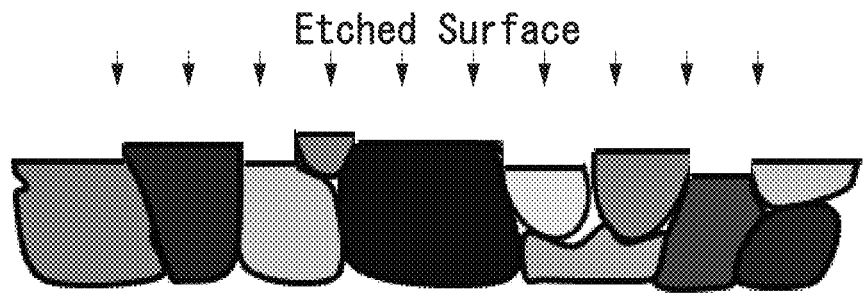

FIGS. 4A to 4C are schematic cross-sectional views for explaining the structure of the lower electrode. FIG. 4A illustrates a state before etching, FIG. 4B illustrates a state after etching using a conventional etching method, and FIG. 4C illustrates a state after etching using an etching method according to the present invention.

As illustrated in FIG. 4A, the metal foil constituting the lower electrode 11 contains many metal grains, and individual metal grains are grown by the heating treatment in the annealing step for the metal foil and in the sintering step for the precursor layer of the dielectric thin film 12 and thus each have significantly larger crystal grain size than before application of the heat treatment. Further, the grain boundary is clearly shown due to regrowth of the metal grains.

As illustrated in FIG. 4B, when a known etching solution such as iron chloride ($FeCl_3$) or hydrogen peroxide-nitrate ($HNO_3.H_2O_2$) is used to half-etch the metal foil (e.g., Ni foil), etching in the crystal grains does not proceed, whereas etching of the grain boundary excessively proceeds, with the result that the metal grains remain, making the etched surface have large unevenness.

On the other hand, as illustrated in FIG. 4C, when a sodium sulphate-based ($NaSO_8.H_2SO_4$) etching solution is used, not only etching of the gran boundary but also etching in the crystal grains proceeds, so that the flatness of the etched surface can be enhanced. The purity in the crystal grains is higher than the purity of the crystal boundary where impurities are precipitated, and the heat conductivity therein is high, so that by exposing the cleaved surfaces of the crystal grains to the surface of the metal foil, heat dissipation property can be enhanced. Thus, when the thin film capacitor 1 is embedded in an LSI-mounted substrate and used as a decoupling capacitor, heat generated from the LSI can be dissipated. Further, the etched surface has an appropriate surface roughness, adhesion between resin and the thin film capacitor 1 embedded therein can be enhanced.

The following describes in detail the practical structure of the thin film capacitor.

Figure 5A:
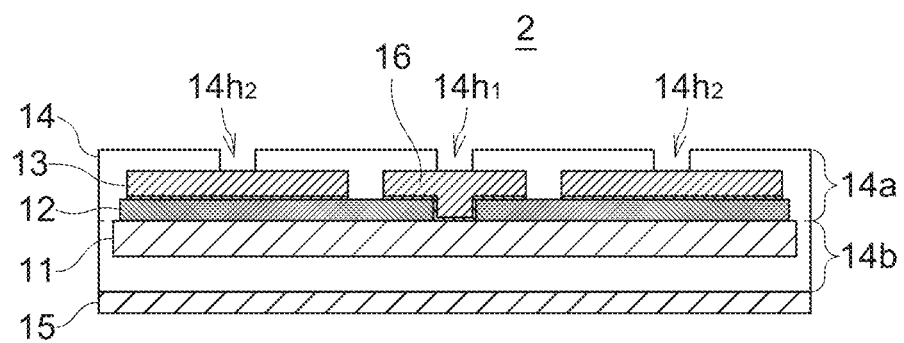
Figure 5B:
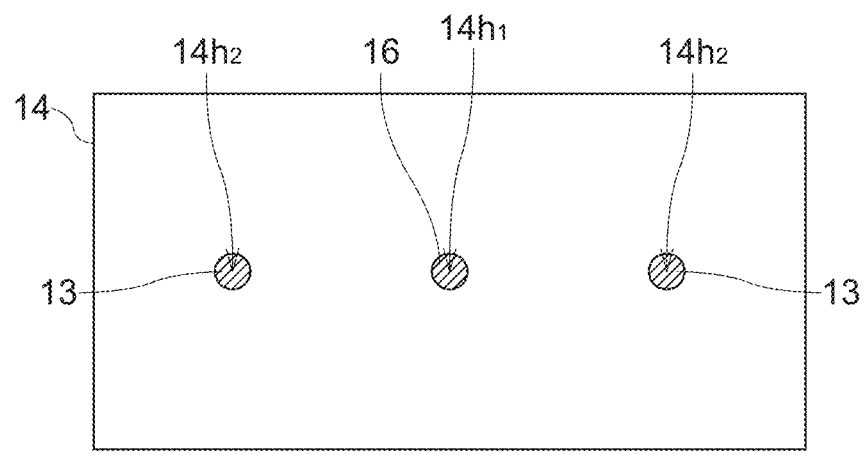
Figure 6A:
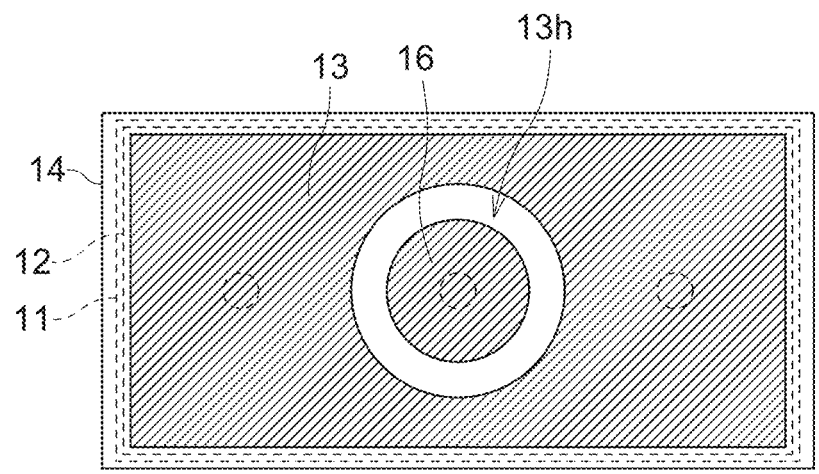
Figure 6B:
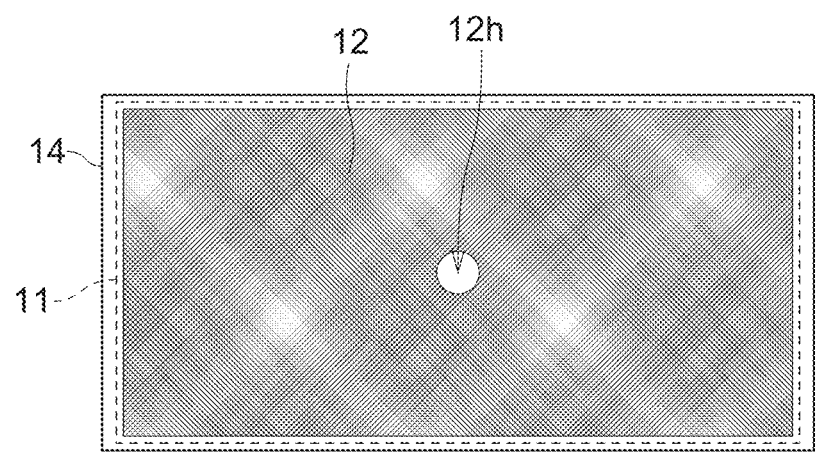
Figure 6C:
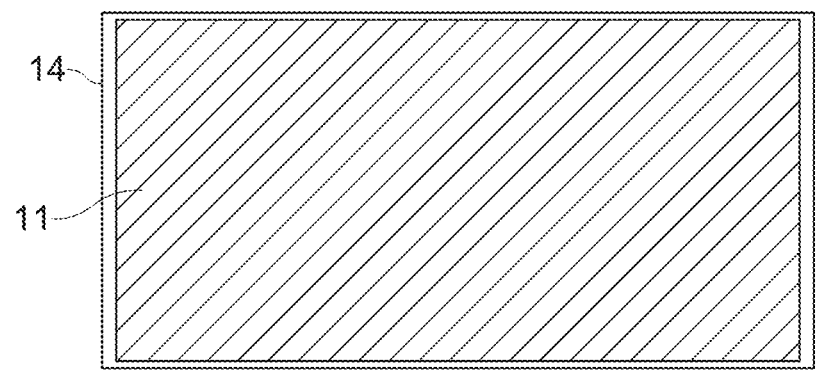

FIGS. 5A and 5B are views illustrating the structure of the thin film capacitor according to a second embodiment of the present invention. FIG. 5A is a schematic side cross-sectional view, and FIG. 5B is a schematic top view. FIGS. 6A to 6C are plan views of the thin film capacitor of FIGS. 5A and 5B. Particularly, FIG. 6A illustrates the upper electrode 13, FIG. 6B illustrates the dielectric thin film 12, and FIG. 6C illustrates the lower electrode 11.

As illustrated in FIGS. 5A and 5B and FIGS. 6A to 6B, a thin film capacitor 2 has a structure in which a capacitor element composed of a laminated body of the lower electrode 11, dielectric thin film 12 and upper electrode 13 is embedded in a resin layer 14. The resin layer 14 includes an upper resin layer 14a that covers the upper surface side of the lower electrode 11 on which the dielectric thin film 12 and upper electrode 13 are laminated and a lower resin layer 14b that covers the lower surface side of the lower electrode 11. The lower resin layer 14b covers not only the lower surface of the lower electrode 11, but also the side surfaces thereof. Further, a DAF (Die Attach Film) 15 is attached to the lower surface of the resin layer 14.

There are formed in the upper surface of the upper resin layer 14a, contact holes $14h_1$ and $14h_2$. The contact hole $14h_1$ exposes therethrough the upper surface of a contact plug 16 connected to the lower electrode 11, and the contact hole $14h_2$ exposes therethrough the upper surface of the upper electrode 13. Electrical connection to the lower electrode 11 can be made through the contact plug 16 exposed through the contact hole $14h_1$. Further, electrical connection to the upper electrode 13 can be made through the contact hole $14h_2$. The contact holes $14h_1$ and $14h_2$ are used also in the inspection of the capacitor.

FIGS. 6A to 6C illustrate the patterns of the respective layer of the lower electrode 11, the dielectric thin film 12 and the upper electrode 13 illustrated in FIGS. 5A and 5B. The dielectric thin film 12 illustrated in FIG. 6B is formed on the upper surface of the lower electrode 11 illustrated in FIG. 6C, and the upper electrode 13 illustrated in FIG. 6A is formed on the upper surface of the dielectric thin film 12. An opening 12h that exposes therethrough the upper surface of the lower electrode 11 is formed in the dielectric thin film 12, and an annular isolating groove 13h is formed in the upper electrode 13. The isolating groove 13h is formed for forming the contact plug 16 insulation-isolated from the upper electrode 13, and a part of the contact plug 16 is embedded in the opening 12h formed in the dielectric thin film 12 to be connected to the upper surface of the lower electrode 11.

When the thin film capacitor 2 is embedded in an LSI-mounted substrate and used as a decoupling capacitor, the insulation resistance of the thin film capacitor may be degraded due to the influence of a hydrogen radical or $H_2O$ generated at the time of embedding in the substrate. The gas generated in the LSI-mounted substrate is not easily vented to the outside of the substrate, and the gas stored in the substrate gradually degrades the quality of the thin film capacitor. However, when the capacitor element has been covered with cured resin, it does not have the influence of the residual gas in the substrate and hence prevents degradation in the insulation resistance. When the capacitor element is embedded in the resin layer 14 as in the present embodiment, gas may be generated when the resin is cured. However, when a simple structure in which a single capacitor element is covered with resin is adopted, the generated gas can be diffused outside. Thus, the gas is not stored in the resin layer 14, thereby preventing degradation in the insulation resistance of the capacitor.

As in the thin film capacitor 1 according to the first embodiment, in the thin film capacitor 2 according to the present embodiment, the lower electrode 11 is subjected to etching at its lower surface 11b to be thinned, so that it is possible to provide a thin film capacitor of a very thin type. Further, the lower surface 11b and side surface 11c of the lower electrode 11 are etched to expose therefrom the cross sections of the metal grains, so that it is possible to enhance flatness of the etched surface while ensuring an appropriate surface roughness and to enhance heat dissipation property. Furthermore, the etched surface of the lower electrode 11 has appropriate surface roughness, and the entire exposed surface of the lower electrode 11 is covered with the resin, so that it is possible to enhance adhesion between the lower electrode 11 and resin and to protect the entire thin film capacitor 2.

FIGS. 7A to 7D and FIGS. 8A to 8D are process views for explaining a manufacturing method for the thin film capacitor 2 according to the second embodiment.

Figure 7A:
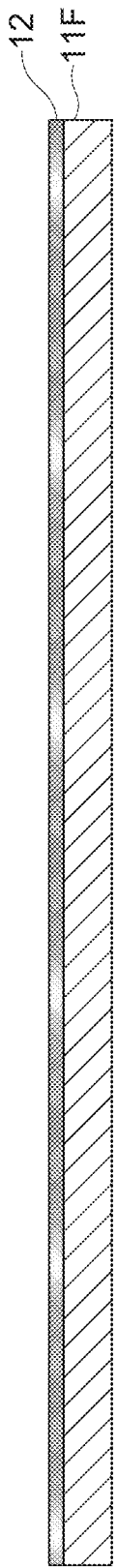
FIGS. 7A to 7D are process views for explaining a manufacturing method for the thin film capacitor according to the second embodiment.
Figure 7B:
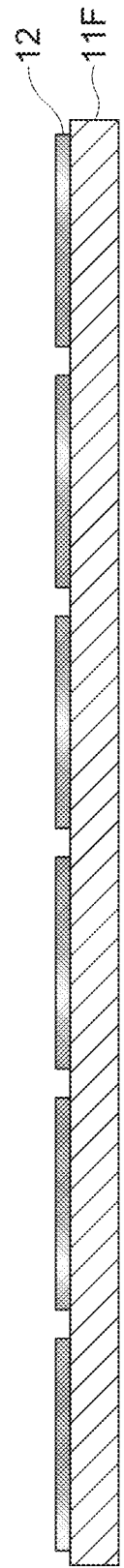

As illustrated in FIGS. 7A to 7D and FIGS. 8A to 8D, in the manufacture of the thin film capacitor 2, a metal foil 11F constituting the lower electrode 11 is prepared. Then, the metal foil 11F is pre-annealed, and the dielectric thin film 12 is formed on the metal foil 11F (FIG. 7A). Metal grains in the metal foil 11F are grown in the annealing step for the metal foil 11F and in the sintering step for the precursor layer of the dielectric thin film 12 until the crystal grain size becomes about 10 μm to 25 μm.

Then, the dielectric thin film 12 is patterned (FIG. 7B), whereby the dielectric thin film 12 is processed to a shape corresponding to each individual capacitor element.

Figure 7C:
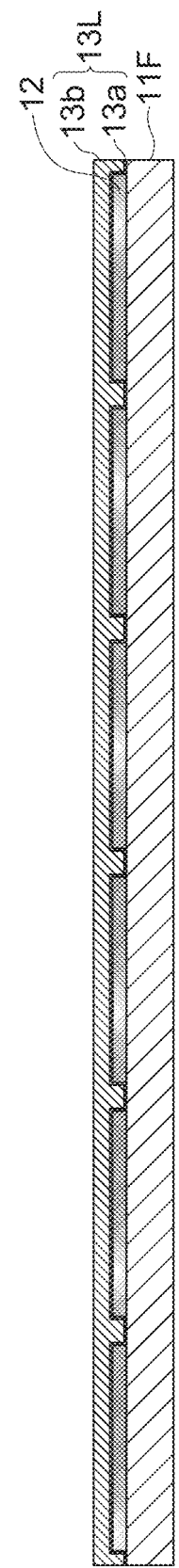
Figure 7D:
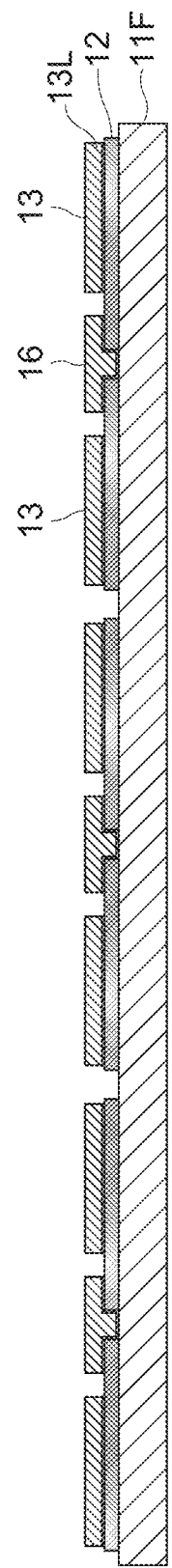

Then, a seed layer 13a for electrolytic copper plating is formed, by, e.g., a sputtering method, on the entire upper surface of the metal foil 11F on which the dielectric thin film 12 is formed. After that, a copper-plated layer 13b is grown by electrolytic plating to form an upper electrode layer 13L (FIG. 7C).

Then, the upper electrode layer 13L is patterned (FIG. 7D), whereby the upper electrode layer 13L is processed to a shape corresponding to each individual capacitor element and, hence, the upper electrode 13 and contact plug 16 are formed.

Figure 8A:
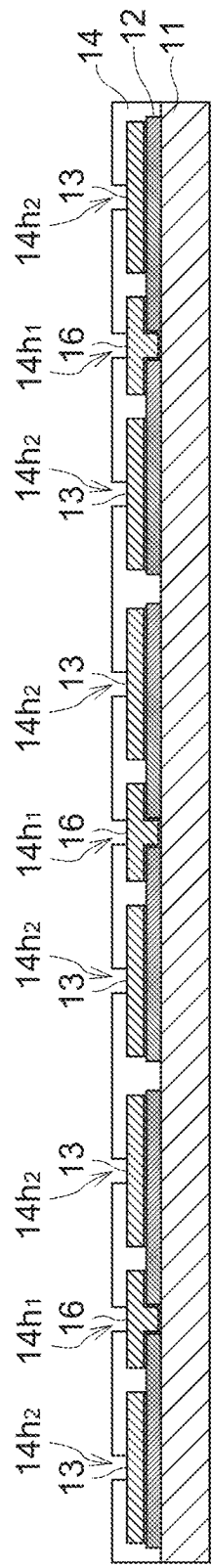
FIGS. 8A to 8D are process views for explaining a manufacturing method for the thin film capacitor according to the second embodiment together with FIGS. 7A to 7D.

Then, the upper resin layer 14a that covers the upper surface of the metal foil 11F is formed. After that, the contact holes $14h_1$ and $14h_2$ that expose therethrough the upper surfaces of the contact plug 16 and upper electrode 13, respectively, are formed (FIG. 8A). The upper resin layer 14a can be formed by lamination of a resin film.

Figure 8B:
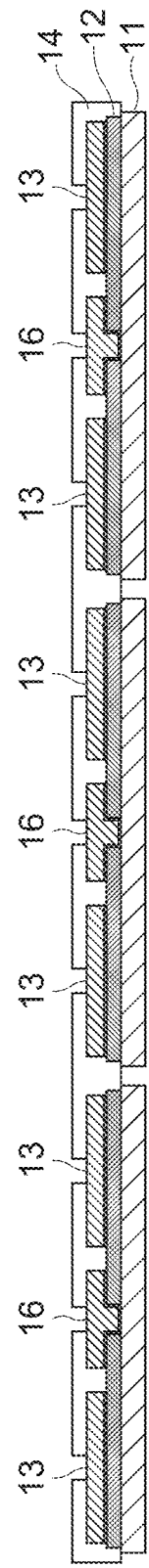

Then, the metal foil 11F is subjected to half-etching at its lower surface to be thinned and is then patterned to a shape corresponding to each individual capacitor element (FIG. 8B). At this time, the upper surface side of the metal foil 11F is covered with the upper resin layer 14a, so that the dielectric thin film 12 and upper electrode 13 are not damaged during the etching process for the metal foil 11F. Further, when the patterning of the metal foil 11F is performed by etching as in the thinning step, the cross sections of the metal grains appears not only from the lower surface of the metal foil 11F, but also from the side surface thereof, so that heat dissipate property and adhesion with the resin can be further enhanced.

Figure 8C:
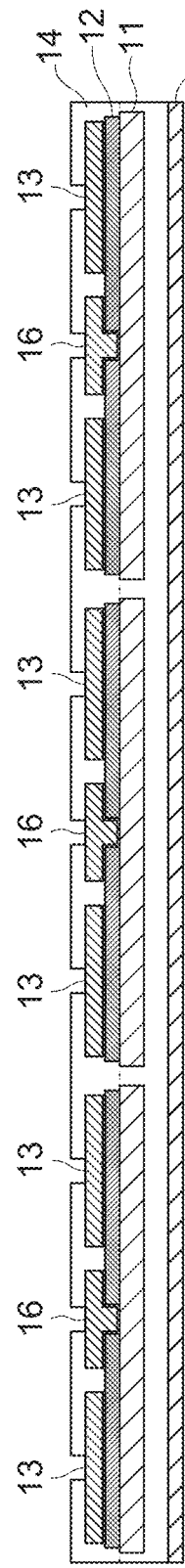

Then, the lower resin layer 14b that covers the lower surface of the metal foil 11F is formed, and the DAF 15 that covers the lower surface of the lower resin layer 14b is formed (FIG. 8C). The lower resin layer 14b can also be formed by lamination of a resin film. The DAF 15 can also be formed by lamination. Thus, both the lower and side surfaces of the metal foil 11F are covered with the resin and, hence, an aggregate of the thin film capacitor 2 is completed.

Figure 8D:
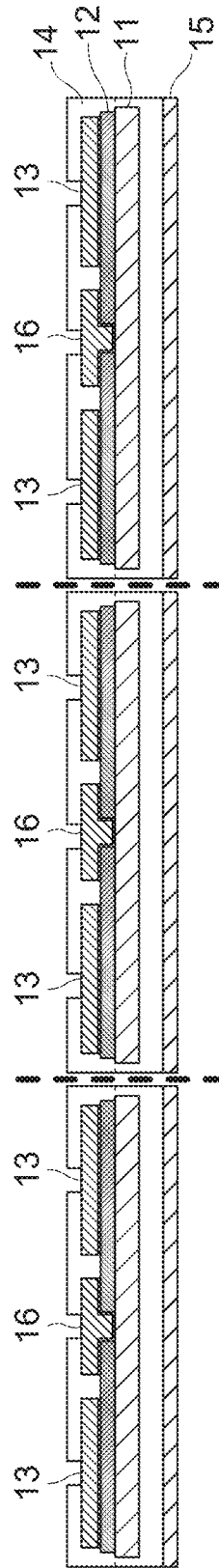

Finally, the obtained aggregate of the thin film capacitor 2 is diced into individual thin film capacitors (FIG. 8D). At this time, only the resin exists on a dicing line, and the upper electrode 13, dielectric thin film 12 and metal foil 11F do not exist thereon. If the dielectric thin film 12 is diced, it may have cracks. Further, if the upper electrode 13 or the metal foil 11F constituting the lower electrode 11 is diced, sagging may occur in the metal cutting surface. However, when the dielectric body or metal is eliminated from the dicing line in advance, the above problem will not arise, and therefore, many capacitor elements can be easily separated. Thus, the thin film capacitor 2 according to the present embodiment is completed.

Thus, as in the thin film capacitor 1 according to the first embodiment, in the thin film capacitor 2 according to the present embodiment, the lower electrode 11 is subjected to etching at its lower surface 11b to be thinned, so that it is possible to provide a thin film capacitor of a very thin type. Further, the etched surface of the lower electrode 11 has high flatness, and there are appropriate height differences among the cross sections of the metal grains, so that heat dissipation property and adhesion can be enhanced. Further, the entire exposed surface of the capacitor element constituted of the lower electrode 11, dielectric thin film 12 and upper electrode 13 is covered with the resin, so that it is possible to prevent degradation in electrical characteristics such as insulation resistance caused due to the influence of a hydrogen radical or $H_2O$ generated at the time of embedding the thin film capacitor into the substrate.

Figure 9:
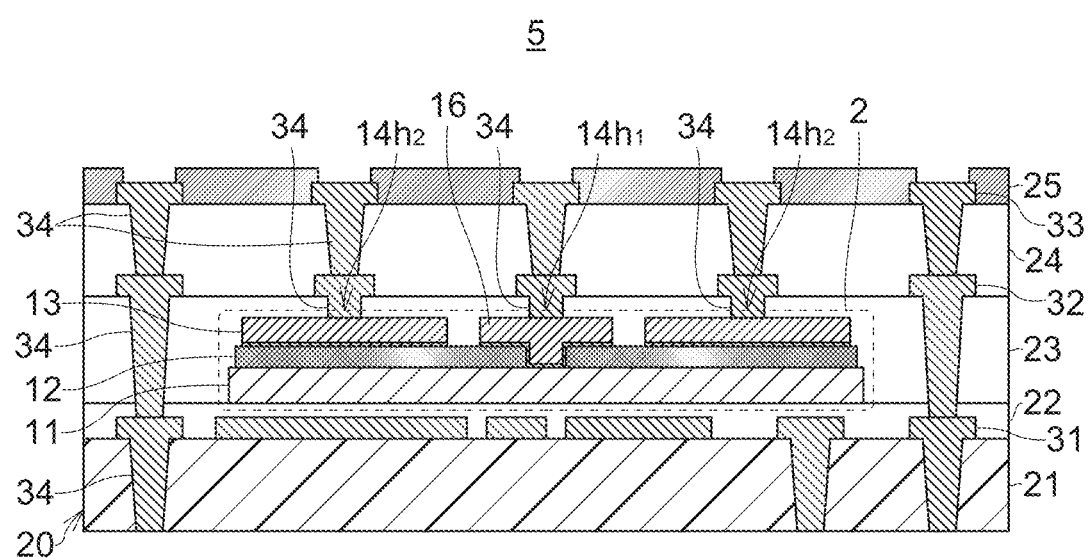
FIG. 9 is a schematic cross-sectional view illustrating the structure of a substrate with built-in electronic component incorporating the thin film capacitor according to the second embodiment.

FIG. 9 is a schematic cross-sectional view illustrating the structure of a substrate with built-in electronic component incorporating the thin film capacitor according to the second embodiment.

As illustrated in FIG. 9, the substrate 5 with built-in electronic component includes a multilayer substrate 20, the thin film capacitor 2 embedded in the multilayer substrate 20, and a plurality of via hole electrodes 34.

The multilayer substrate 20 according to the present embodiment has a structure in which a first resin layer 21, a first wiring layer 31, a second resin layer 22, a third resin layer 23, a second wiring layer 32, a fourth resin layer 24, a third wiring layer 33 and a fifth resin layer 25 are laminated in this order. The first resin layer 21 is, e.g., a core substrate and may be an organic substrate made of glass epoxy resin or BT (Bismaleimide-Triazine) resin. The core substrate may have an RCC (Resin Coated Copper) structure.

In the present embodiment, the thin film capacitor 2 is provided on the upper surface of the second resin layer (first insulating layer), and the lower surface of the lower electrode 11 of the thin film capacitor 2 contacts the upper surface of the second resin layer 22. The thin film capacitor 2 is embedded in the third resin layer 23 (second insulating layer). The second resin layer 22, third resin layer 23 and fourth resin layer 24 are each an interlayer insulating layer for insulation-isolating the upper and lower wiring layers from each other, and the fifth resin layer 25 is a protective insulating layer that selectively covers the third wiring layer 33. The material of the second to fifth resin layers 22 to 25 can be, but is not particularly limited to, an insulating material such as polyimide resin, epoxy resin, acrylic resin or phenol resin. The resin layers may contain fillers having insulating property or high electrical resistance.

The via hole electrodes 34 penetrate their corresponding resin layers so as to vertically draw the wiring layer. In the third resin layer 23, there are formed a contact hole $14h_1$ (first contact hole) that exposes therethrough the upper surface of the contact plug and a contact hole $14h_2$ (second contact hole) that exposes therethrough the upper surface of the upper electrode 13. The via hole electrode 34 (first via hole electrode) formed in the contact hole $14h_1$ is connected to the lower electrode 11 of the thin film capacitor 2 through the contact plug 16. The via hole electrode 34 (second via hole electrode) formed in the contact hole $14h_2$ is connected to the upper electrode 13 of the thin film capacitor 2.

Thus, the substrate 5 with built-in electronic component according to the present embodiment incorporates the thin film capacitor 2 of a very thin type in the multilayer substrate 20, so that the entire substrate can be thinned.

While the preferred embodiments of the present invention have been described, the present invention is not limited to the above embodiments, and various modifications may be made within the scope of the present invention. Accordingly, all such modifications are included in the present invention.

For example, in the above second embodiment, the exposed surface of the lower electrode 11 that is not covered with the dielectric thin film 12 is covered as a whole with the resin; however, it is possible to adopt a structure in which only the upper and lower surfaces 11a and 11b of the lower electrode 11 are covered with the resin, while the side surface 11c thereof is exposed.

EXAMPLES

Comparative Example

A rolled Ni foil having a thickness of 28 μm was annealed, and then a film of barium titanate was formed on the Ni foil by a sputtering method, followed by heating treatment at 800° C. for 60 minutes to sinter the barium titanate. In the annealing, annealing temperature, annealing time and temperature-rising rate were set to 900° C., two hours and 100° C./min, respectively. Then, a Cu film having a thickness of 5 μm was formed by electrolytic plating. Thereafter, the Ni foil was subjected to half-etching at its lower surface to be thinned to 10 μm. In the half-etching, $HNO_3.H_2O_2$ was used as an etching solution.

Thereafter, the etched surface of the Ni foil was observed using a SEM, and surface roughness (height difference) was evaluated. The results are shown in FIGS. 10A and 10B.

Figure 10A:
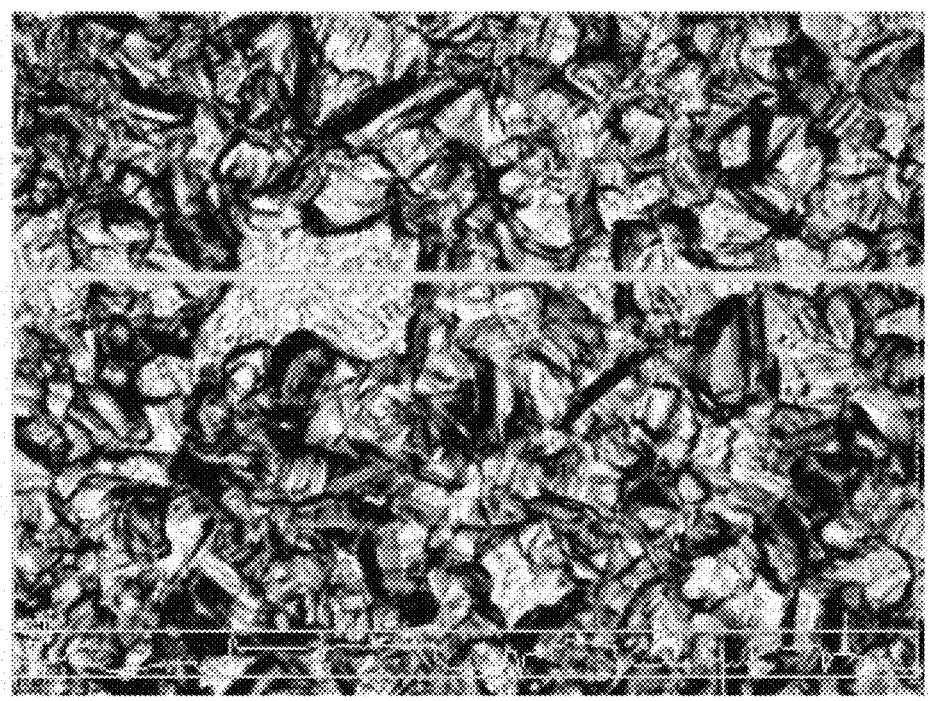
Figure 10B:
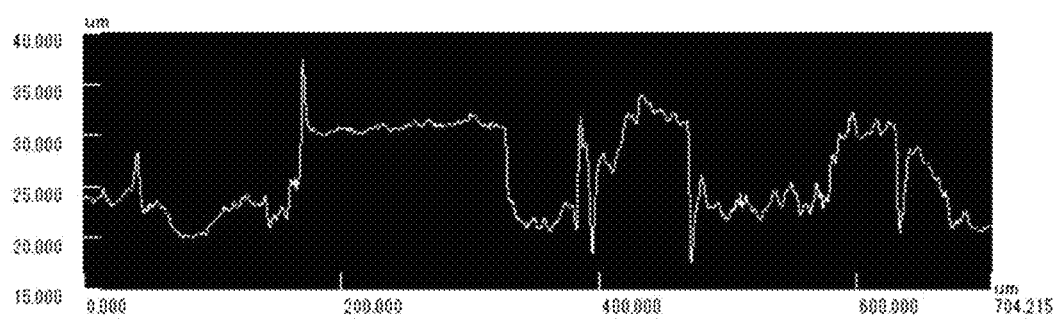

As can be seen from the SEM image of FIG. 10A, a grain boundary existing between the Ni grains clearly appears from the etched surface of the Ni foil, making the image very stereoscopic. Further, as illustrated in FIG. 10B, the height difference in the etched surface is 15 μm or more, and a surface roughness Ra of the etched surface is 2.2, exhibiting poor flatness. Further, it is found from EBSD measurement results that a variation in the plane orientation of the crystal grains is large. Particularly, the relationship among the number $N_{111}$ of the metal grains each of whose (111) plane±20° appears, the number $N_{100}$ of the metal grains each of whose (100) plane±20° appears, and the number $N_{110}$ of the metal grains each of whose (110) plane±20° appears is $N_{100} > N_{110} > N_{111}$.

Example 1

An electrolytic Ni foil having a thickness of 28 μm was annealed, and then a film of barium titanate was formed on the Ni foil by a sputtering method, followed by heating treatment at 800° C. for 60 minutes to sinter the barium titanate. In the annealing, annealing temperature, annealing time and temperature-rising rate were set to 900° C., two hours and 100° C./min, respectively. Then, a Cu film having a thickness of 5 μm was formed by electrolytic plating. Then, a sample of the thin film capacitor was produced under the same conditions as for the above Comparative Example except that $Na_2SO_8.H_2SO_4$ was used as an etching solution in the application of half-etching to the lower surface of the Ni foil for thinning. Thereafter, the etched surface was evaluated. The results are shown in FIGS. 11A and 11B.

Figure 11A:
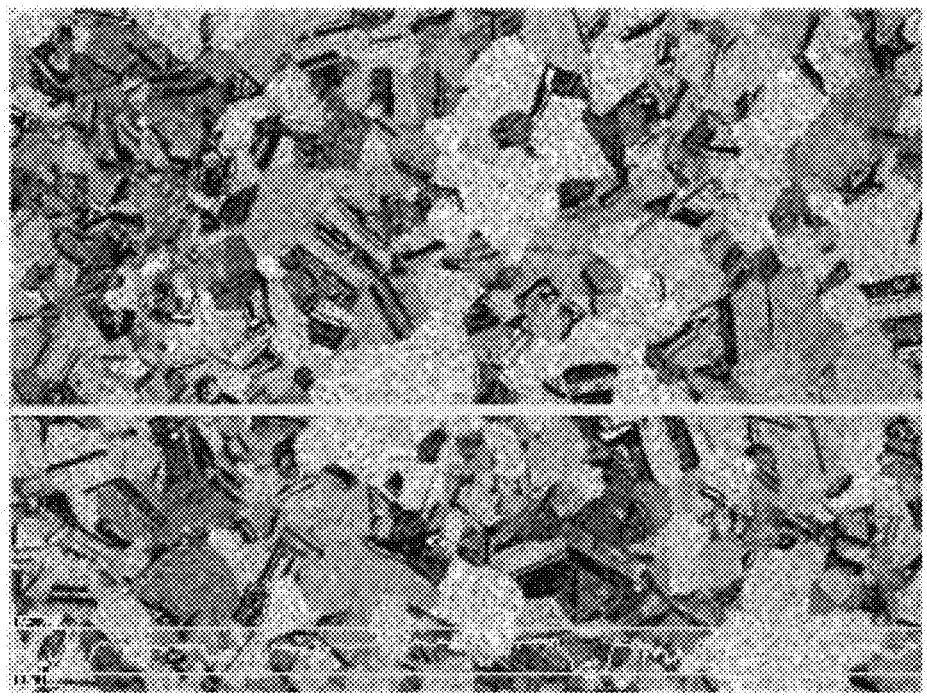
Figure 11B:
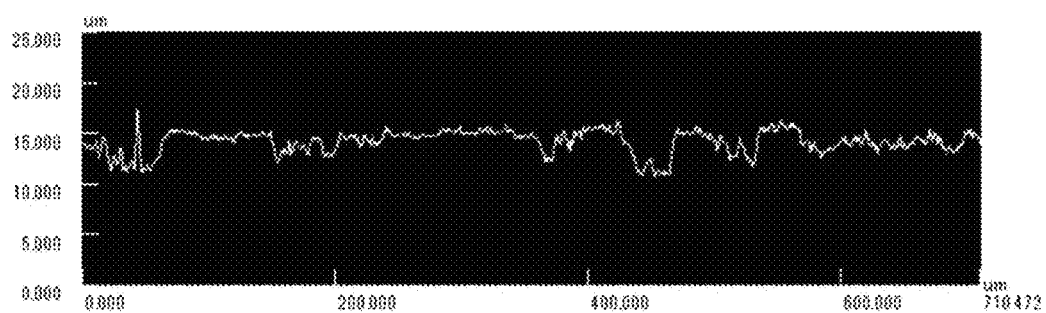

As can be seen from the SEM image of FIG. 11A, the cross sections of Ni grains appear from the etched surface, the number of grain boundaries is small, and flatness of the etched surface is high. Further, as illustrated in FIG. 11B, the height difference in the etched surface is about 7 μm, and the surface roughness Ra of the etched surface is 1.1, exhibiting higher flatness than in the Comparative Example. Further, it is found from EBSD measurement results that the (111) plane is most often observed as the plane orientation of the crystal grains in the etched surface, exhibiting a small variation in the plane orientation of the crystal grains. Particularly, the relationship among the number $N_{111}$ of the metal grains each of whose (111) plane±20° appears, the number $N_{100}$ of the metal grains each of whose (100) plane±20° appears, and the number $N_{110}$ of the metal grains each of whose (110) plane±20° appears is $N_{111} > N_{100} > N_{110}$.

Example 2

A sample of the thin film capacitor was produced under the same conditions as for Example 1 except that a leveling agent to be used in the electrolytic plating process was added. After that, the etched surface was evaluated. The results are shown in FIGS. 12A and 12B.

Figure 12A:
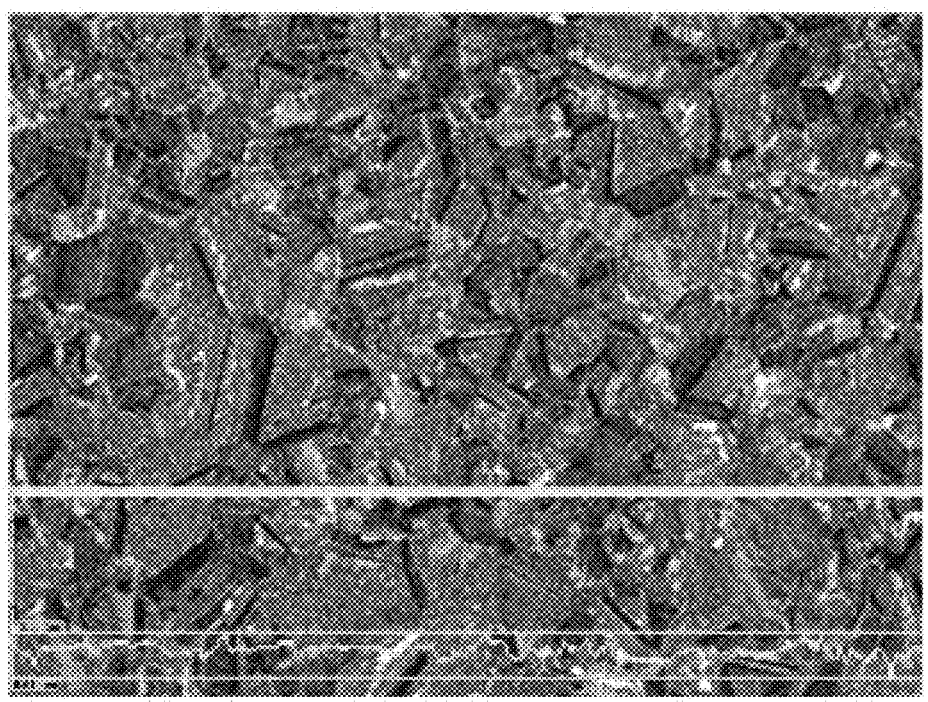
Figure 12B:
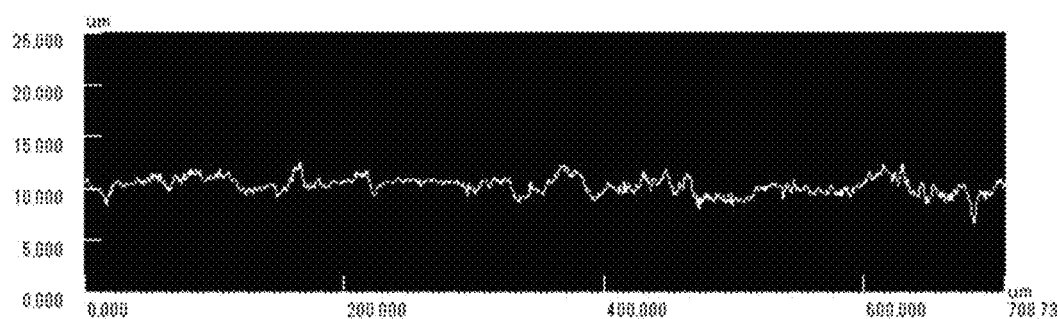

As can be seen from the SEM image of FIG. 12A, the cross sections of Ni grains appear from the etched surface, the number of grain boundaries is small, and the flatness of the etched surface is high. Further, as illustrated in FIG. 12B, the height difference in the etched surface is about 6 μm, and the surface roughness Ra of the etched surface is 0.5, exhibiting higher flatness than in Example 1. Further, it is found from EBSD measurement results that the (111) plane is most often observed as the plane orientation of the crystal grains in the etched surface, exhibiting a small variation in the plane orientation of the crystal grains. Further, as in Example 1, the relationship among the number $N_{111}$ of the metal grains each of whose (111) plane±20° appears, the number $N_{100}$ of the metal grains each of whose (100) plane±20° appears, and the number $N_{110}$ of the metal grains each of whose (110) plane±20° appears is $N_{111} > N_{100} > N_{110}$.

What is claimed is:

1. A thin film capacitor comprising:
    a lower electrode made of a metal foil containing many metal grains;
    a dielectric thin film formed on an upper surface of the lower electrode; and
    an upper electrode formed on an upper surface of the dielectric thin film, wherein
    a lower surface of the lower electrode is an etched surface from which cross sections of the metal grains appear, and
    a height difference between the cross sections of adjacent metal grains in the etched surface is 1 μm or more and 8 μm or less.

2. The thin film capacitor as claimed in claim 1, wherein
    a number of the metal grains each of whose cross section of (111) plane±20° appears from the etched surface is $N_{111}$,
    a number of the metal grains each of whose cross section of (100) plane±20° appears from the etched surface is $N_{100}$,
    a number of the metal grains each of whose cross section of (110) plane±20° appears from the etched surface is $N_{110}$, and
    a relationship: $N_{111} > N_{100} > N_{110}$ is satisfied.

3. The thin film capacitor as claimed in claim 1, wherein an average grain size of the metal grains is 10 μm or more and 25 μm or less.

4. The thin film capacitor as claimed in claim 1, wherein the metal foil is an Ni foil, and the metal grains are Ni grains.

5. The thin film capacitor as claimed in claim 1, wherein a side surface of the lower electrode is the etched surface from which the cross sections of the metal grains appear like the lower surface of the lower electrode.

6. A substrate with built-in electronic component comprising:
   a multilayer substrate;
   a thin film capacitor embedded in an inside of the multilayer substrate and including a lower electrode made of a metal foil containing many metal grains, a dielectric thin film formed on the upper surface of the lower electrode, and an upper electrode formed on the upper surface of the dielectric thin film;
   a first via hole electrode formed in the multilayer substrate so as to be electrically connected to the lower electrode of the thin film capacitor; and
   a second via hole electrode formed in the multilayer substrate so as to be electrically connected to the upper electrode of the thin film capacitor, wherein
   the lower surface of the lower electrode is an etched surface from which cross sections of the metal grains appear,
   the height difference between the cross sections of adjacent metal grains is 1 μm or more and 8 μm or less.

7. The substrate with built-in electronic component as claimed in claim 6, wherein
   the multilayer substrate includes a first insulating layer and a second insulating layer formed on the upper surface of the first insulating layer,
   the thin film capacitor is provided on the upper surface of the first insulating layer,
   the second insulating layer is formed on the upper surface of the first insulating layer so as to embed therein the thin film capacitor,
   the first via hole electrode is provided in a first contact hole formed in the second insulating layer so as to expose therethrough the lower electrode, and
   the second via hole electrode is provided in a second contact hole formed in the second insulating layer so as to expose therethrough the upper electrode.

* * * * *